US009214359B2

(12) United States Patent
Chopra (10) Patent No.: US 9,214,359 B2
(45) Date of Patent: Dec. 15, 2015

(54) METHOD AND APPARATUS FOR SIMULTANEOUSLY REMOVING MULTIPLE CONDUCTIVE MATERIALS FROM MICROELECTRONIC SUBSTRATES

(71) Applicant: Micron Technology, Inc., Boise, ID (US)

(72) Inventor: Dinesh Chopra, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/281,606

(22) Filed: May 19, 2014

(65) Prior Publication Data

US 2014/0377953 A1 Dec. 25, 2014

Related U.S. Application Data

(60) Continuation of application No. 11/844,459, filed on Aug. 24, 2007, now abandoned, which is a continuation of application No. 10/923,359, filed on Aug. 20, 2004, now abandoned, which is a division of application No. 10/230,602, filed on Aug. 29, 2002, now Pat. No. 7,129,160.

(51) Int. Cl.
*H01L 21/4763* (2006.01)
*H01L 21/302* (2006.01)
(Continued)

(52) U.S. Cl.
CPC .............. *H01L 21/3213* (2013.01); *B23H 5/08* (2013.01); *C25F 3/02* (2013.01); *C25F 3/30* (2013.01);
(Continued)

(58) Field of Classification Search
CPC .............. B23H 5/08; C25F 3/02; C25F 3/30; C25F 7/00; H01L 21/32115; H01L 21/32125; H01L 21/3213; H01L 21/32134; H01L 21/7684

USPC ......... 438/627, 643, 645, 648, 653, 656, 672, 438/685, 687, 690, 692, 746, 754; 257/E21.303; 205/646, 662, 663, 674; 216/38, 83, 86, 95, 96, 99, 100, 105, 216/106, 108
See application file for complete search history.

(56) References Cited

U.S. PATENT DOCUMENTS 2,315,695 A 4/1943 Faust
2,516,105 A 7/1950 der Mateosian
(Continued)

FOREIGN PATENT DOCUMENTS

EP 0459397 A2 12/1991
EP 0527514 A1 2/1993
(Continued)

OTHER PUBLICATIONS

Aboaf, J.A., et al., IBM Technical Disclosure Bulletin, Rounding of Square-Shape Holes in Silicon Wafers, vol. 19, No. 8, p. 3042, Jan. 1977, XP-002235690, NN 77013042.
(Continued)

*Primary Examiner* — Nadine Norton
*Assistant Examiner* — Christopher Remavege
(74) *Attorney, Agent, or Firm* — Perkins Coie LLP (57) ABSTRACT

A method and apparatus for simultaneously removing conductive materials from a microelectronic substrate. A method in accordance with one embodiment of the invention includes contacting a surface of a microelectronic substrate with an electrolytic liquid, the microelectronic substrate having first and second different conductive materials. The method can further include controlling a difference between a first open circuit potential of the first conducive material and a second open circuit potential of the second conductive material by selecting a pH of the electrolytic liquid. The method can further include simultaneously removing at least portions of the first and second conductive materials by passing a varying electrical signal through the electrolytic liquid and the conductive materials. Accordingly, the effects of galvanic interactions between the two conductive materials can be reduced and/or eliminated.

20 Claims, 7 Drawing Sheets

(51) Int. Cl.

| | | |
|---|---|---|
| *B44C 1/22* | (2006.01) | |
| *H01L 21/3213* | (2006.01) | |
| *B23H 5/08* | (2006.01) | |
| *C25F 3/02* | (2006.01) | |
| *C25F 3/30* | (2006.01) | |
| *C25F 7/00* | (2006.01) | |
| *H01L 21/321* | (2006.01) | |
| *H01L 21/768* | (2006.01) | |

(52) U.S. Cl.
CPC ............ *C25F 7/00* (2013.01); *H01L 21/32115* (2013.01); *H01L 21/32125* (2013.01); *H01L 21/32134* (2013.01); *H01L 21/7684* (2013.01)

(56) References Cited

U.S. PATENT DOCUMENTS

| | | | |
|---|---|---|---|
| 3,239,439 | A | 3/1966 | Helmke |
| 3,334,210 | A | 8/1967 | Williams et al. |
| 4,613,417 | A | 9/1986 | Laskowski et al. |
| 4,839,005 | A | 6/1989 | Katsumoto et al. |
| 5,098,533 | A | 3/1992 | Duke et al. |
| 5,162,248 | A | 11/1992 | Dennison et al. |
| 5,244,534 | A | 9/1993 | Yu et al. |
| 5,300,155 | A | 4/1994 | Sandhu et al. |
| 5,344,539 | A | 9/1994 | Shinogi et al. |
| 5,562,529 | A | 10/1996 | Kishii et al. |
| 5,567,300 | A | 10/1996 | Datta et al. |
| 5,575,885 | A | 11/1996 | Hirabayashi et al. |
| 5,618,381 | A | 4/1997 | Doan et al. |
| 5,624,300 | A | 4/1997 | Kishii et al. |
| 5,676,587 | A | 10/1997 | Landers et al. |
| 5,681,423 | A | 10/1997 | Sandhu et al. |
| 5,780,358 | A | 7/1998 | Zhou et al. |
| 5,800,248 | A | 9/1998 | Pant et al. |
| 5,807,165 | A | 9/1998 | Uzoh et al. |
| 5,840,629 | A | 11/1998 | Carpio |
| 5,843,818 | A | 12/1998 | Joo et al. |
| 5,846,398 | A | 12/1998 | Carpio |
| 5,863,307 | A | 1/1999 | Zhou et al. |
| 5,888,866 | A | 3/1999 | Chien |
| 5,897,375 | A | 4/1999 | Watts et al. |
| 5,911,619 | A | 6/1999 | Uzoh et al. |
| 5,930,699 | A | 7/1999 | Bhatia |
| 5,934,980 | A | 8/1999 | Koos et al. |
| 5,952,687 | A | 9/1999 | Kawakubo et al. |
| 5,954,975 | A | 9/1999 | Cadien et al. |
| 5,954,997 | A | 9/1999 | Kaufman et al. |
| 5,972,792 | A | 10/1999 | Hudson |
| 5,993,637 | A | 11/1999 | Hisamatsu et al. |
| 6,001,730 | A | 12/1999 | Farkas et al. |
| 6,007,695 | A | 12/1999 | Knall et al. |
| 6,010,964 | A | 1/2000 | Glass |
| 6,024,856 | A | 2/2000 | Haydu et al. |
| 6,033,953 | A | 3/2000 | Aoki et al. |
| 6,039,633 | A | 3/2000 | Chopra |
| 6,046,099 | A | 4/2000 | Cadien et al. |
| 6,051,496 | A | 4/2000 | Jang |
| 6,060,386 | A | 5/2000 | Givens |
| 6,060,395 | A | 5/2000 | Skrovan et al. |
| 6,063,306 | A | 5/2000 | Kaufman et al. |
| 6,066,030 | A | 5/2000 | Uzoh |
| 6,066,559 | A | 5/2000 | Gonzalez et al. |
| 6,068,787 | A | 5/2000 | Grumbine et al. |
| 6,077,412 | A | 6/2000 | Ting et al. |
| 6,083,840 | A | 7/2000 | Mravic et al. |
| 6,100,197 | A | 8/2000 | Hasegawa |
| 6,103,096 | A | 8/2000 | Datta et al. |
| 6,103,628 | A | 8/2000 | Talieh |
| 6,103,636 | A | 8/2000 | Zahorik et al. |
| 6,115,233 | A | 9/2000 | Seliskar et al. |
| 6,117,781 | A | 9/2000 | Lukanc et al. |
| 6,121,152 | A | 9/2000 | Adams et al. |
| 6,132,586 | A | 10/2000 | Adams et al. |
| 6,143,155 | A | 11/2000 | Adams et al. |
| 6,162,681 | A | 12/2000 | Wu |
| 6,171,467 | B1 | 1/2001 | Weihs et al. |
| 6,174,425 | B1 | 1/2001 | Simpson et al. |
| 6,176,992 | B1 | 1/2001 | Talieh |
| 6,180,947 | B1 | 1/2001 | Stickel et al. |
| 6,187,651 | B1 | 2/2001 | Oh |
| 6,190,494 | B1 | 2/2001 | Dow |
| 6,196,899 | B1 | 3/2001 | Chopra et al. |
| 6,197,182 | B1 | 3/2001 | Kaufman et al. |
| 6,206,756 | B1 | 3/2001 | Chopra et al. |
| 6,218,309 | B1 | 4/2001 | Miller et al. |
| 6,250,994 | B1 | 6/2001 | Chopra et al. |
| 6,259,128 | B1 | 7/2001 | Adler et al. |
| 6,273,786 | B1 | 8/2001 | Chopra et al. |
| 6,276,996 | B1 | 8/2001 | Chopra |
| 6,280,581 | B1 | 8/2001 | Cheng |
| 6,287,974 | B1 | 9/2001 | Miller |
| 6,299,741 | B1 | 10/2001 | Sun et al. |
| 6,303,956 | B1 | 10/2001 | Sandhu et al. |
| 6,313,038 | B1 | 11/2001 | Chopra et al. |
| 6,322,422 | B1 | 11/2001 | Satou |
| 6,328,632 | B1 | 12/2001 | Chopra |
| 6,368,184 | B1 | 4/2002 | Beckage |
| 6,368,190 | B1 | 4/2002 | Easter et al. |
| 6,379,223 | B1 | 4/2002 | Sun et al. |
| 6,395,152 | B1 | 5/2002 | Wang |
| 6,395,607 | B1 | 5/2002 | Chung |
| 6,416,647 | B1 | 7/2002 | Dordi et al. |
| 6,455,370 | B1 | 9/2002 | Lane |
| 6,461,911 | B2 | 10/2002 | Ahn et al. |
| 6,464,855 | B1 | 10/2002 | Chadda et al. |
| 6,504,247 | B2 | 1/2003 | Chung |
| 6,515,493 | B1 | 2/2003 | Adams et al. |
| 6,537,144 | B1 | 3/2003 | Tsai et al. |
| 6,551,935 | B1 | 4/2003 | Sinha et al. |
| 6,599,806 | B2 | 7/2003 | Lee |
| 6,603,117 | B2 | 8/2003 | Corrado et al. |
| 6,605,539 | B2 | 8/2003 | Lee et al. |
| 6,607,988 | B2 | 8/2003 | Yunogami et al. |
| 6,620,037 | B2 | 9/2003 | Kaufman et al. |
| 6,632,335 | B2 | 10/2003 | Kunisawa et al. |
| 6,689,258 | B1 | 2/2004 | Lansford et al. |
| 6,693,036 | B1 | 2/2004 | Nogami et al. |
| 6,705,926 | B2 | 3/2004 | Zhou et al. |
| 6,722,942 | B1 | 4/2004 | Lansford et al. |
| 6,722,950 | B1 | 4/2004 | Dabral et al. |
| 6,726,823 | B1 | 4/2004 | Wang et al. |
| 6,736,952 | B2 | 5/2004 | Emesh et al. |
| 6,753,250 | B1 | 6/2004 | Hill et al. |
| 6,776,693 | B2 | 8/2004 | Duboust et al. |
| 6,780,772 | B2 | 8/2004 | Uzoh et al. |
| 6,797,623 | B2 | 9/2004 | Sato et al. |
| 6,808,617 | B2 | 10/2004 | Sato et al. |
| 6,811,680 | B2 | 11/2004 | Chen et al. |
| 6,846,227 | B2 | 1/2005 | Sato et al. |
| 6,848,970 | B2 | 2/2005 | Manens et al. |
| 6,852,630 | B2 | 2/2005 | Basol et al. |
| 6,858,124 | B2 | 2/2005 | Zazzera et al. |
| 6,867,136 | B2 | 3/2005 | Basol et al. |
| 6,867,448 | B1 | 3/2005 | Lee et al. |
| 6,881,664 | B2 | 4/2005 | Catabay et al. |
| 6,884,338 | B2 | 4/2005 | Kesari et al. |
| 6,893,328 | B2 | 5/2005 | So |
| 6,899,804 | B2 | 5/2005 | Duboust et al. |
| 6,951,599 | B2 | 10/2005 | Yahalom et al. |
| 6,977,224 | B2 | 12/2005 | Dubin et al. |
| 7,074,113 | B1 | 7/2006 | Moore |
| 7,078,308 | B2 | 7/2006 | Lee et al. |
| 7,094,131 | B2 | 8/2006 | Lee et al. |
| 7,112,121 | B2 | 9/2006 | Lee et al. |
| 7,112,122 | B2 | 9/2006 | Lee et al. |
| 7,129,160 | B2 | 10/2006 | Chopra |
| 7,134,934 | B2 | 11/2006 | Lee et al. |
| 7,153,195 | B2 | 12/2006 | Lee et al. |
| 7,153,410 | B2 | 12/2006 | Moore et al. |
| 7,153,777 | B2 | 12/2006 | Lee |
| 7,160,176 | B2 | 1/2007 | Lee et al. |
| 7,192,335 | B2 | 3/2007 | Lee et al. |
| 7,220,166 | B2 | 5/2007 | Lee et al. |

(56) References Cited

U.S. PATENT DOCUMENTS

| | | |
|---|---|---|
| 7,229,535 B2 | 6/2007 | Wang et al. |
| 2001/0035354 A1 | 11/2001 | Ashjaee et al. |
| 2002/0025763 A1 | 2/2002 | Lee et al. |
| 2002/0104764 A1 | 8/2002 | Banerjee et al. |
| 2002/0115283 A1 | 8/2002 | Ho et al. |
| 2002/0130049 A1 | 9/2002 | Chen et al. |
| 2003/0010648 A1 | 1/2003 | Sun et al. |
| 2003/0064669 A1 | 4/2003 | Basol et al. |
| 2003/0113996 A1 | 6/2003 | Nogami et al. |
| 2003/0136684 A1 | 7/2003 | Duboust et al. |
| 2003/0178320 A1 | 9/2003 | Liu et al. |
| 2003/0234184 A1 | 12/2003 | Liu et al. |
| 2004/0154931 A1 | 8/2004 | Hongo et al. |
| 2004/0192052 A1 | 9/2004 | Mukherjee et al. |
| 2004/0259479 A1 | 12/2004 | Sevilla |
| 2005/0016861 A1 | 1/2005 | Laursen et al. |
| 2005/0020192 A1 | 1/2005 | Lee et al. |
| 2005/0056550 A1 | 3/2005 | Lee et al. |
| 2005/0133379 A1 | 6/2005 | Basol et al. |
| 2005/0173260 A1 | 8/2005 | Basol et al. |
| 2005/0178743 A1 | 8/2005 | Manens et al. |
| 2006/0042956 A1 | 3/2006 | Lee et al. |
| 2006/0163083 A1 | 7/2006 | Andricacos et al. |
| 2006/0189139 A1 | 8/2006 | Lee |
| 2006/0199351 A1 | 9/2006 | Lee et al. |
| 2006/0208322 A1 | 9/2006 | Lee et al. |
| 2006/0234604 A1 | 10/2006 | Lee et al. |
| 2008/0045009 A1 | 2/2008 | Chopra |

FOREIGN PATENT DOCUMENTS

| | | |
|---|---|---|
| EP | 1123956 A1 | 8/2001 |
| EP | 1386695 A2 | 2/2004 |
| JP | 1241129 A | 9/1989 |
| JP | 06120182 A | 4/1994 |
| JP | 10335305 A | 12/1998 |
| JP | 11145273 A | 5/1999 |
| JP | 2000269318 A | 9/2000 |
| JP | 2001077117 A1 | 3/2001 |
| JP | 2002093758 A | 3/2002 |
| TW | 516471 B | 1/2003 |
| WO | 0026443 A2 | 5/2000 |
| WO | 0028586 A2 | 5/2000 |
| WO | 0032356 A1 | 6/2000 |
| WO | 0059008 A2 | 10/2000 |
| WO | 0059682 A1 | 10/2000 |
| WO | 02064314 A1 | 8/2002 |
| WO | 03072672 A1 | 9/2003 |
| WO | 02085570 A2 | 10/2012 |

OTHER PUBLICATIONS

ATMI, Inc., adapted from a presentation at the Semicon West '99 Low Dielectric Materials Technology Conference, San Francisco, California, Jul. 12, 1999, pp. 13-25.

Bassous, E., IBM Technical Disclosure Bulletin, Low Temperature Methods for Rounding Silicon Nozzles, vol. 20, No. 2, Jul. 1977, pp. 810-811, XP-002235692, NN 7707810.

Bernhardt, A.F.,et al., "Electrochemical Planarization for Multi-Level Metallization of Microcircuitry," CircuiTree, vol. 8, No. 10, pp. 38, 40, 42, 44, 46, and 48, Oct. 1995.

D'Heurle, F.M., et al., IBM Technical Disclosure Bulletin, Electrolytic Process for Metal Pattern Generation, vol. 17, No. 1, pp. 271-272, Jun. 1974, XP-002235691, NN 7406271.

Frankenthal, R.P., et al., "Electroetching of Platinum in the Titanium—Platinum—Gold Metallization Silicon Integrated Circuits," Journal of the Electrochemical Society, vol. 123, No. 5, pp. 703-706, May 1976, Pennington, New Jersey.

Huang, C.S. et al., "A Novel UV Baking Process to Improve DUV Photoresist Hardness," pp. 135-138, Proceedings of the 1999 International Symposium, VLSI Technology, Systems, and Applications: Proceedings of Technical Papers: Jun. 8-10, 1999, Taipei, Taiwan, Institute of Electrical and Electronics Engineers, Inc., Sep. 1999.

Juchniewicz, R. et al. "Influence of Pulsed Current Plantinised Titanium and Tantalum Anode Durability," International Congress Metallic Corrosion, Proceedings—vol. 3, pp. 449-453, Toronto, Jun. 3/7, 1984.

Kondo, S. et al., "Abrasive-Free Polishing for Copper Damascene Interconnection," Journal of the Electrochemical Society, vol. 147, No. 10, pp. 3907-3913, The Electrochemical Society, Inc., Pennington, New Jersey, 2000.

McGraw-Hill, "Chemical bonding," Concise Encyclopedia of Science & Technology, Fourth Edition, Sybil P. Parker, Editor in Chief, p. 367, McGraw-Hill, New York, 1998.

Micro Photonics, Inc. CSM Application Bulletin. Low-load Micro Scratch Tester (MST) for characterization of thin polymer films [online], 3 pages, retrieved from the Internet Jul. 25, 2002. <http://www.microphotonics.com/mstABpoly.html>.

Micro Photonics, Inc. CSM Nano Hardness Tester [online], 6 pages, retrieved from the Internet Jul. 29, 2002. <http://www.microphotonics.com/nht.html>.

PhysicsWorld. Hard Materials (excerpt of Superhard superlattices) [online], S. Barnett and A. Madan, Physics World, Jan. 1998, Institute of Physics Publishing Ltd., Bristol, United Kingdom, retrieved from the Internet, Jul. 29, 2002 <http://physicsweb.org/box/world/11/1/11/world-11-1-11-1>.

METHOD AND APPARATUS FOR SIMULTANEOUSLY REMOVING MULTIPLE CONDUCTIVE MATERIALS FROM MICROELECTRONIC SUBSTRATES

CROSS-REFERENCE TO RELATED APPLICATION(S)

This application is a continuation of U.S. application Ser. No. 11/844,459, now abandoned, which is a continuation of U.S. application Ser. No. 10/923,359 filed Aug. 20, 2004, now abandoned, which is a divisional of U.S. application Ser. No. 10/230,602 filed Aug. 29, 2002, now U.S. Pat. No. 7,129,160 issued Oct. 31, 2006, each of which is incorporated herein by reference in their entirety.

This application is related to the following U.S. patent applications, all of which are incorporated herein by reference: Ser. No. 09/651 779 filed Aug. 30, 2000 now U.S. Pat. No. 7,074,113 issued Jul. 11, 2006; Ser. No. 09/651,808 filed Aug. 30, 2000, now U.S. Pat. No. 6,602,117 issued Aug. 5, 2003; Ser. No. 09/653,392 filed Aug. 31, 2000, now U.S. Pat. No. 6,551,935 issued Apr. 22, 2003; Ser. No. 09/888,084 filed Jun. 21,2001, now U.S. Pat. No. 7,112,121 issued Sep. 26, 2006; Ser. No. 09/887,767 filed Jun. 21, 2001, now U.S. Pat. No. 7,094,131 issued Aug. 22, 2006; and Ser. No. 09/888,002 filed Jun. 21, 2001, now U.S. Pat. No. 7,160,176 issued Jan. 9, 2007. Also incorporated herein by reference are the following U.S. patent applications Ser. No.: 10/230,970 filed Aug. 29, 2002, now U.S. Pat. No. 7,220,166 issued May, 22, 2007; application Ser. No. 10/230,972 filed Aug. 29, 2002, now U.S. Pat. No. 7,134,934 issued Nov. 14, 2006; application Ser. No. 10/230,973 filed Aug. 29, 2002, now U.S. Pat. No. 7,153,195 issued Dec. 26, 2006; applicaton Ser. No. 10/230,463 filed Aug. 29, 2002, now U.S. Pat. No. 7,192.335 issued Mar. 20, 2007; and Pat. No. 10/230,628 filed Aug. 29, 2002 now U.S. Pat. No. 7,078,308 issued Jul. 18, 2006.

TECHNICAL FIELD

The present disclosure is directed toward methods and apparatuses for simultaneously removing multiple conductive materials from microelectronic substrates.

BACKGROUND

Microelectronic substrates and substrate assemblies typically include a semiconductor material having features, such as memory cells, that are linked with conductive lines. The conductive lines can be formed by first forming trenches or other recesses in the semiconductor material and then overlaying a conductive material (such as a metal) in the trenches. The conductive material is then selectively removed to leave conductive lines or vias extending from one feature in the semiconductor material to another.

Figure 1:
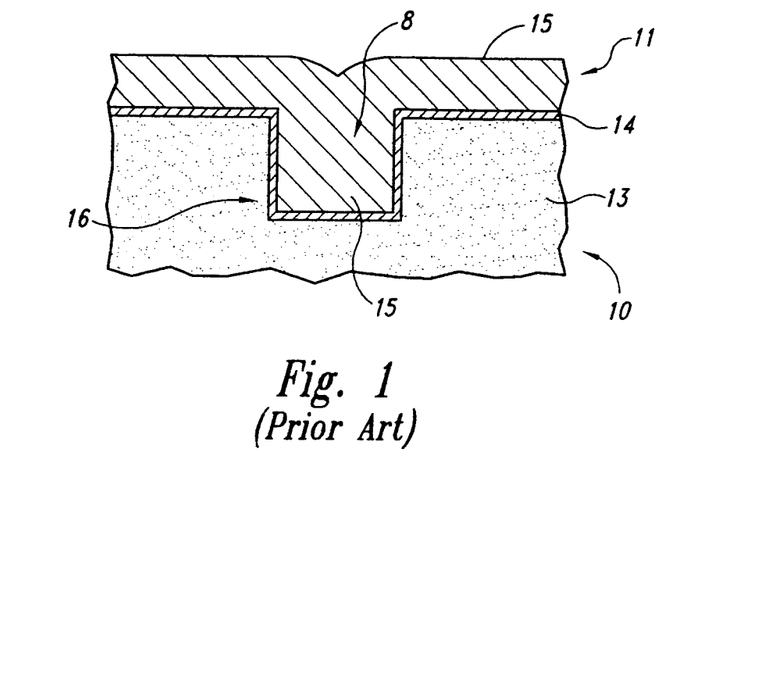
FIG. 1 is a partially schematic, cross-sectional view of a portion of a microelectronic substrate having multiple conductive materials processed in accordance with the prior art.

FIG. 1 is a partially schematic illustration of a portion of a microelectronic substrate 10 having a conductive line formed in accordance with the prior art. The microelectronic substrate 10 includes an aperture or recess 16 in an oxide material 13. A barrier layer 14, formed from materials such as tantalum or tantalum compounds, is disposed on the microelectronic substrate 10 and in the aperture 16. A conductive material 15, such as copper, is then disposed on the barrier layer 14. The barrier layer 14 can prevent copper atoms from migrating into the surrounding oxide 13.

In a typical existing process, two separate chemical-mechanical planarization (CMP) steps are used to remove the excess portions of the conductive material 15 and the barrier layer 14 from the microelectronic substrate 10. In one step, a first slurry and polishing pad are used to remove the conductive material 15 overlying the barrier layer 14 external to the aperture 16, thus exposing the barrier layer 14. In a separate step, a second slurry and a second polishing pad are then used to remove the barrier layer 14 (and the remaining conductive material 15) external to the aperture 16. The resulting conductive line 8 includes the conductive material 15 surrounded by a lining formed by the barrier layer 14.

One drawback with the foregoing process is that high downforces are typically required to remove copper and tantalum from the microelectronic substrate 10. High downforces can cause other portions of the microelectronic substrate 10 to become dished or eroded, and/or can smear structures in other parts of the microelectronic substrate 10. A further drawback is that high downforces typically are not compatible with soft substrate materials. However, it is often desirable to use soft materials, such as ultra low dielectric materials, around the conductive features to reduce and/or eliminate electrical coupling between these features.

SUMMARY

The present invention is directed toward methods and apparatuses for simultaneously removing multiple conductive materials from a microelectronic substrate. A method in accordance with one aspect of the invention includes contacting a surface of a microelectronic substrate with an electrolytic liquid, the microelectronic substrate having a first conductive material and a second conductive material different than the first. The method can still further include controlling an absolute value of a difference between a first open circuit potential of the first conductive material and a second open circuit potential of the second conductive material by selecting a pH of the electrolytic liquid. The method can further include simultaneously removing at least portions of the first and second conductive materials by passing a varying electrical signal through the electrolytic liquid and the conductive materials while the electrolytic liquid contacts the microelectronic substrate.

In a further aspect of the invention, wherein the first conductive material includes tungsten and the second conductive material includes copper, the method can include controlling an absolute value of a difference between the first open circuit potential and the second open circuit potential to be about 0.50 volts or less by selecting the pH of the electrolytic liquid to be from about 2 to about 5. The conductive materials can be removed simultaneously by passing an electrical signal from a first electrode spaced apart from the microelectronic substrate, through the electrolytic liquid to the first and second conductive materials and from the first and second conductive materials through the electrolytic liquid to a second electrode spaced apart from the first electrode and spaced apart from the microelectronic substrate.

A method in accordance with another aspect of the invention includes providing a microelectronic substrate having a first conductive material and a second conductive material different than the first. The method can further include disposing on the microelectronic substrate an electrolytic liquid having a pH that controls a difference between a first open circuit potential of the first conductive material and a second open circuit potential on the second conductive material. The method can further include simultaneously removing at least portions of the first and second conductive materials by passing a variable electrical signal through the electrolytic liquid and the conductive materials while the electrolytic liquid contacts the microelectronic substrate.

An electrolytic liquid in accordance with another embodiment of the invention can include a liquid carrier and an electrolyte disposed in the liquid carrier. The electrolyte can be configured to transmit electrical signals from an electrode to the first and second conductive materials of the microelectronic substrate. A pH of the electrolytic liquid can be from about 2 to about 5.

DETAILED DESCRIPTION

The present disclosure describes methods and apparatuses for removing conductive materials from a microelectronic substrate. The term "microelectronic substrate" is used throughout to include a substrate upon which and/or in which microelectronic circuits or components, data storage elements or layers, and/or micro-mechanical elements are fabricated. Features in the substrate can include submicron features (having submicron dimensions ranging from, for example, 0.1 micron to 0.75 micron) such as trenches, vias, lines and holes. It will be appreciated that several of the details set forth below are provided to describe the following embodiments in a manner sufficient to enable a person skilled in the relevant art to make and use the disclosed embodiments. Several of the details and advantages described below, however, may not be necessary to practice certain embodiments of the invention. Additionally, the invention can include other embodiments that are within the scope of the claims but are not described in detail with respect to FIG. 2A-9.

One approach for addressing some of the drawbacks described above with reference to FIG. 1 is to remove conductive materials from the microelectronic substrate with electrolytic processes. Accordingly, a voltage is applied to the conductive material in the presence of an electrolytic liquid to remove the conductive material. However, many existing electrolytic liquids cannot simultaneously remove copper and tantalum, once the tantalum barrier layer has been exposed. Accordingly, chemical-mechanical planarization (CMP) techniques are typically used to remove the exposed tantalum barrier layer and the adjacent copper material. However, this approach typically re-introduces the high downforces that the initial electrolytic process was intended to avoid. Accordingly, another approach has been to replace the tantalum barrier layer with a tungsten barrier layer. However, tungsten (and tungsten compounds) typically form a galvanic couple with copper, which results in one or the other of these materials corroding and dissolving at an uncontrolled rate. The following disclosure describes methods and apparatuses for overcoming this drawback.

Figure 2A:
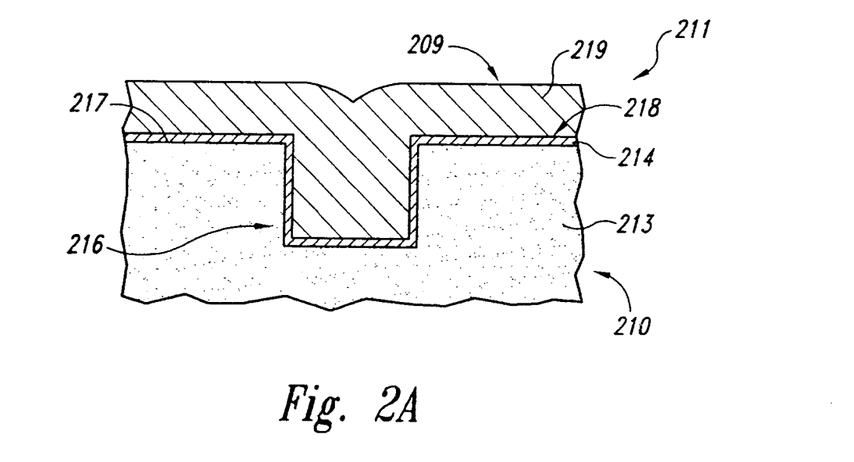
FIGS. 2A-2C are partially schematic, cross-sectional illustrations of a portion of a microelectronic substrate having multiple conductive materials processed in accordance with an embodiment of the invention.

FIG. 2A is a partially schematic, cross-sectional side view of a microelectronic substrate 210 prior to electrolytic processing in accordance with an embodiment of the invention. In one aspect of this embodiment, the microelectronic substrate 210 includes a substrate material 213, such as an oxide or a low dielectric constant material. The substrate material 213 includes a substrate material surface 217 having an aperture 216 formed by conventional processes, such as selective etch processes. A first conductive material 218 is disposed on the substrate material 213 and can form a barrier layer 214 along the walls of the aperture 216. A second conductive material 209, such as a blanket fill material, can be disposed on the first conductive material 218 to form a fill layer 219. In one embodiment, the first conductive material 218 can include tungsten (W) or a tungsten compound, such as tungsten nitride ($WN_x$), and the second conductive material 209 can include copper or copper alloys such as alloys that include at least 50% copper. In other embodiments, these conductive materials can include other elements or compounds. In any of these embodiments, the first conductive material 218 and the second conductive material 209 can collectively define a conductive portion 211 of the microelectronic substrate 210.

To form an isolated conductive line within the aperture 216, the first conductive material 218 and second conductive material 219 external to the aperture 216 are typically removed. In one embodiment, the second conductive material 209 is removed using a CMP process. In other embodiments, an electrochemical-mechanical polishing (ECMP) process or an electrolytic process is used to remove the second conductive material 209. An advantage of electrolytic and ECMP processes is that the downforce applied to the microelectronic substrate 210 during processing can be reduced or eliminated. Apparatuses for performing these processes are described in greater detail below with reference to FIGS. 4-9. In any of these embodiments, the result after completing this portion of the process is a microelectronic substrate 210 having the second conductive material 209 external to the aperture 216 and external to the barrier layer 214 removed, as is shown in FIG. 2B.

Figure 2B:
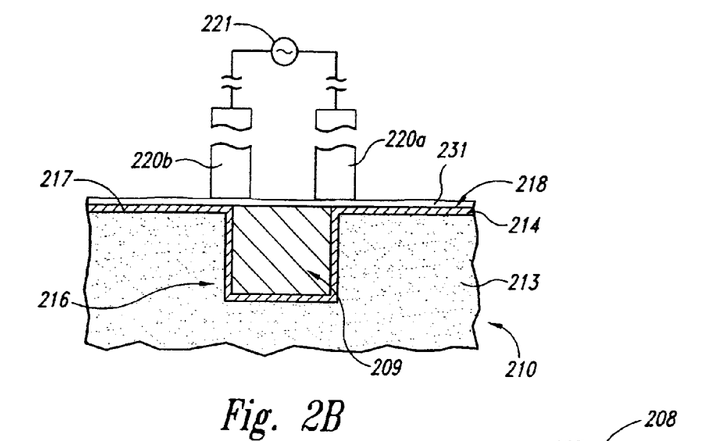

Referring now to FIG. 2B, a process in accordance with one embodiment of the invention includes simultaneously, electrolytically removing the portions of the second conductive material 209 and the first conductive material 218 that extend beyond the substrate material surface 217 after the initial removal process described above with reference to FIG. 2A. Accordingly, in one aspect of this embodiment, an electrolytic liquid 231 can be disposed on the microelectronic substrate 210 and a pair of electrodes 220 (shown as a first electrode 220a and a second electrode 220b) can be positioned in electrical communication with the electrolytic liquid 231. The electrodes 220 can be coupled to a variable signal transmitter 221 (such as a variable current source) to provide a varying electrical signal to both the first conductive material 218 and the second conductive material 209. These conductive materials can be simultaneously removed via an electrolytic process In a further aspect of this embodiment, the pH of the electrolytic liquid 231 is selected to control the difference between the open circuit potential of the first conductive material 218 and the open circuit potential of the second conductive material 209. As used herein, the difference in open circuit potentials between the first conductive material 218 and the second conductive material 209 refers to the difference in electrical potential that would result when measuring the voltage difference between the first conductive material 218 and the second conductive material 209 in the presence of the electrolytic liquid 231, but in the absence of any current applied by the signal transmitter 221. In a particular aspect of this embodiment, for example, when the first conductive material 218 includes tungsten and the second conductive material 209 includes copper, the pH of the electrolytic liquid 231 can be selected to be from about 2 to about 5 to produce a difference in open circuit potential of from about 0.50 volts to about −0.50 volts. In other words, the absolute value of the difference in open circuit potential can be about 0.50 volts or less. In other embodiments, the absolute value of the difference in open circuit potential can be about 0.25 volts or less, for example, 0.15 volts or less. In still further embodiments, the pH of the electrolytic liquid 231 can have other values to produce near-zero open circuit potential differentials for other combinations of first conductive materials 218 and second conductive materials 209. For example, in one embodiment, the electrolytic liquid 231 can have a pH of from about 0 to about 7.

In any of the foregoing embodiments, the first and second conductive materials 218, 209 can be removed simultaneously without necessarily being removed at the same rates. For example, in one embodiment for which the first conductive material 218 includes tungsten or a tungsten compound and the second conductive material 209 includes copper, the copper can be removed at about four times the rate at which the tungsten or tungsten compound is removed. In other embodiments, the first and second conductive materials 218, 209 can be removed at rates that vary by greater or lesser amounts.

In one embodiment, the pH of the electrolytic liquid 231 can be controlled by disposing an acid in the electrolytic liquid 231. Accordingly, the electrolytic liquid 231 can include a liquid carrier (such as deionized water) and an acid such as nitric acid, acetic acid, hydrochloric acid, sulfuric acid, or phosphoric acid. In other embodiments, the electrolytic liquid 231 can include other acids. In addition to reducing the pH of the electrolytic liquid 231, the acid can provide ions to enhance the electrolytic action of the electrolytic liquid 231. In any of these embodiments, the electrolytic liquid 231 can also optionally include an inhibitor, such as benzotriazole (BTA) to produce more uniform material removal. The electrolytic liquid 231 can also include oxidizers, such as hydroxylamine, peroxide or ammonium persulfate. In another embodiment, the oxidizers can be eliminated, for example, when the electrolytic action provided by the electrodes 220 is sufficient to oxidize the conductive materials 218 and 209.

Figure 2C:
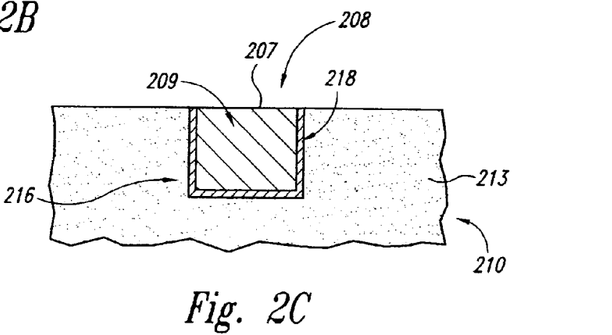

In any of the foregoing embodiments, the first conductive material 218 and the second conductive material 209 external to the recess 216 can be removed, producing a microelectronic substrate 210 having an embedded conductive structure 208, as shown in FIG. 2C. In one embodiment, the conductive structure 208 can include a conductive line and in other embodiments, conductive structure 208 can include a via or other feature in the microelectronic substrate 210. In any of these embodiments, the foregoing processes can provide a conductive structure 208 having a smooth external surface 207 that includes smooth external surface portions for both the first conductive material 218 and the second conductive material 209.

One feature of an embodiment of the method described above with reference to FIGS. 2A-2C is that the pH of the electrolytic liquid 231 can be selected to reduce or eliminate the open circuit potential differential between the first conductive material 218 and the second conductive material 209. An advantage of this feature is that the likelihood for a galvanic reaction, which can preferentially pit, dissolve, or otherwise remove one of the conductive materials more readily than the other, can be reduced and/or eliminated. Accordingly, the resulting external surface 207 that includes the first conductive material 218 and the second conductive material 209 can be clean and uniform, as shown in FIG. 2C. Another advantage of this feature is that the first conductive material 218 and the second conductive material 209 can be removed simultaneously without requiring high downforces which can damage structures and features of the microelectronic substrate 210.

Figure 3:
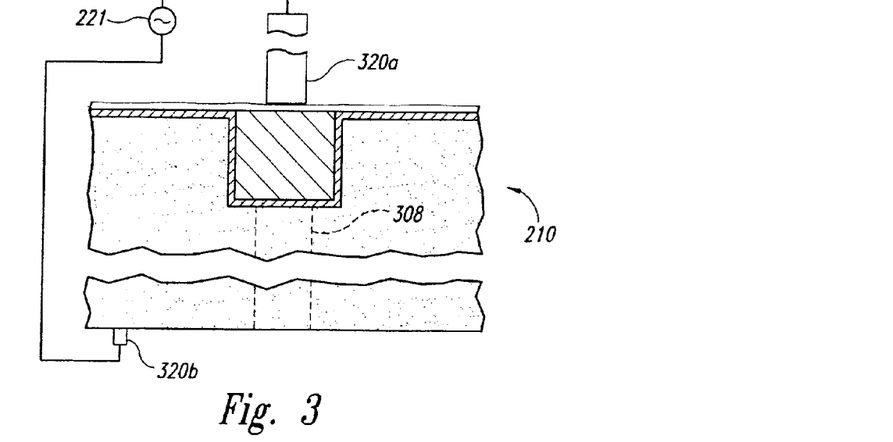
FIG. 3 is a partially schematic, cross-sectional view of a portion of a microelectronic substrate having multiple conductive materials processed in accordance with another embodiment of the invention.

In the embodiments described above with reference to FIGS. 2A-2C, the first and second electrodes 220a, 220b are spaced apart from the microelectronic substrate 210 as they remove conductive materials from the microelectronic substrate 210. An advantage of this arrangement is that the conductive material removal process can be relatively uniform. In other embodiments, one or more of the electrodes can be positioned in direct contact with the microelectronic substrate 210. For example, as shown in FIG. 3, a first electrode 320a can be positioned in a spaced apart orientation relative to the microelectronic substrate 210, and a second electrode 320b can be connected to a rear surface of the microelectronic substrate 210. A conductive path 308 (such as an internal via) between the rear surface and the conductive portion 211 of the microelectronic substrate can complete the circuit between the electrodes 320a, 320b, allowing the signal transmitter 221 to remove conductive material in a manner generally similar to that described above. In still another embodiment, the second electrode 320b can be connected directly to the microelectronic substrate 210. Such arrangements can be used when material removal nonuniformities which may result from the direct contact between the electrode and the microelectronic substrate are remote from regions that might be adversely affected by such nonuniformities.

FIGS. 4-9 illustrate apparatuses for electrolytically, chemically-mechanically, and/or electrochemically-mechanically removing material from microelectronic substrates to perform the processes described above with reference to FIGS. 2A-3. Beginning with FIG. 4, an apparatus 460 can electrolytically remove conductive material from the microelectronic substrate 210 in accordance with an embodiment of the invention. In one aspect of this embodiment, the apparatus 460 includes liquid support, such as a vessel 430 containing an electrolytic liquid or gel 431. A support member 440 supports the microelectronic substrate 210 relative to the vessel 430 so that the conductive portion 211 of the microelectronic substrate 210 contacts the electrolytic liquid 431. In another aspect of this embodiment, the support member 440 can be coupled to a substrate drive unit 441 that moves the support member 440 and the substrate 210 relative to the vessel 430. For example, the substrate drive unit 441 can translate the support member 440 (as indicated by arrow "A") and/or rotate the support member 440 (as indicated by arrow "B").

Figure 4:
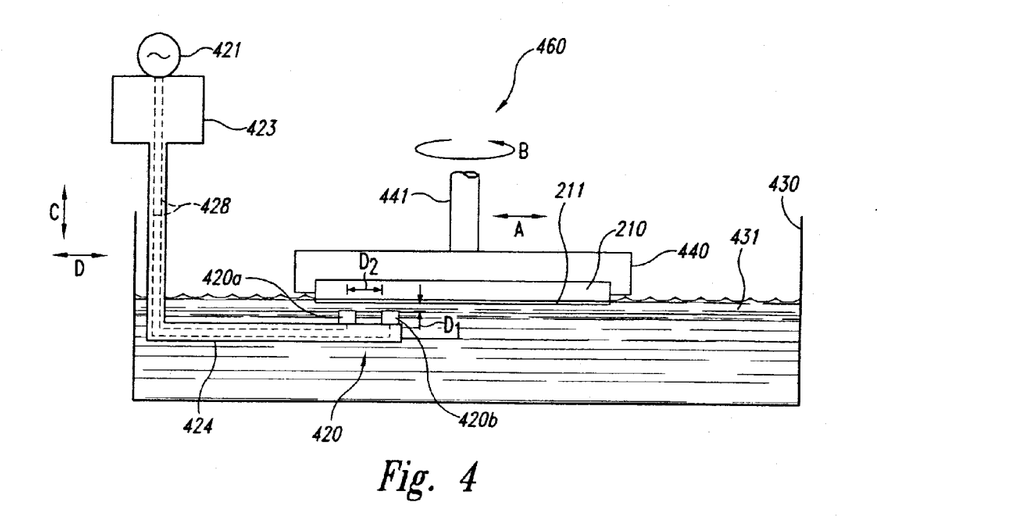
FIG. 4 is a partially schematic illustration of an apparatus for electrolytically removing conductive materials from a microelectronic substrate in accordance with an embodiment of the invention.

The apparatus 460 can further include a first electrode 420a and a second electrode 420b (referred to collectively as electrodes 420) supported relative to the microelectronic substrate 210 by a support arm 424. In one aspect of this embodiment, the support arm 424 is coupled to an electrode drive unit 423 for moving the electrodes 420 relative to the microelectronic substrate 210. For example, the electrode drive unit 423 can move the electrodes 420 toward and away from the conductive portion 211 of the microelectronic substrate 210, (as indicated by arrow "C"), and/or transversely (as indicated by arrow "D") in a plane generally parallel to the conductive portion 211. In other embodiments, the electrode drive unit 423 can move the electrodes 420 in other fashions, or the electrode drive unit 423 can be eliminated when the substrate drive unit 441 provides sufficient relative motion between the substrate 210 and the electrodes 420.

In either embodiment described above with reference to FIG. 4, the electrodes 420 can be coupled to a signal transmitter 421 with leads 428 for supplying electrical current to the electrolytic liquid 431 and the conductive portion 211. In operation, the signal transmitter 421 can supply an alternating current (signal phase or multi-phase) to the electrodes 420. The current passes through the electrolytic liquid 431 and reacts electrochemically with the conductive portion 211 to remove material (for example, atoms or groups of atoms) from the conductive portion 211. The electrodes 420 and/or the microelectronic substrate 210 can be moved relative to each other to remove material from select regions of the conductive portion 211, or from the entire conductive portion 211.

In one aspect of an embodiment of the apparatus 460 shown in FIG. 4, a distance $D_1$ between the electrodes 420 and the conductive portion 211 is set to be smaller than a distance $D_2$ between the first electrode 420a and the second electrode 420b. Furthermore, the electrolytic liquid 431 generally has a higher resistance than the conductive portion 211. Accordingly, the alternating current follows the path of least resistance from the first electrode 420a, through the electrolytic liquid 431 to the conductive portion 211 and back through the electrolytic liquid 431 to the second electrode 420b, rather than from the first electrode 420a directly through the electrolytic liquid 431 to the second electrode 420b. In one aspect of this embodiment, the resistance of the electrolytic liquid 431 can be increased as the thickness of the conductive portion 211 decreases (and the resistance of the conductive portion 211 increases) to maintain the current path described above. In another embodiment, a low dielectric material (not shown) can be positioned between the first electrode 420a and the second electrode 420b to decouple direct electrical communication between the electrodes 420 that does not first pass through the conductive portion 211.

Figure 5:
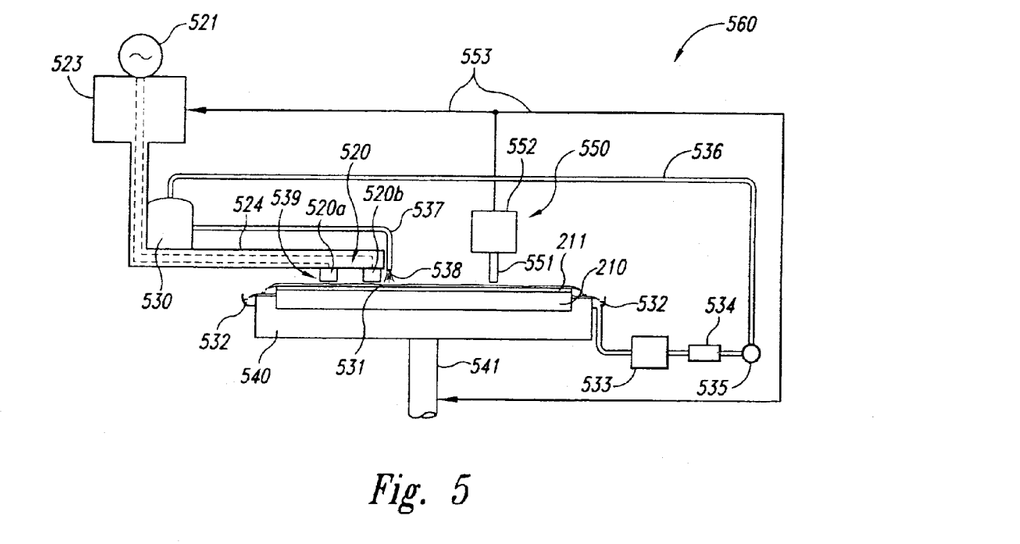
FIG. 5 is a partially schematic illustration of an apparatus for electrolytically removing conductive materials from a microelectronic substrate in accordance with another embodiment of the invention.

FIG. 5 is a partially schematic, side elevation view of an apparatus 560 that includes a support member 540 positioned to support the microelectronic substrate 210 in accordance with another embodiment of the invention. In one aspect of this embodiment, the support member 540 supports the microelectronic substrate 210 with the conductive portion 211 facing upwardly. A substrate drive unit 541 can move the support member 540 and the microelectronic substrate 210, as described above with reference to FIG. 4. Electrodes 520, including first and second electrodes 520a and 520b, are positioned above the conductive portion 211 and are coupled to a current source 521. A support arm 524 supports the electrodes 520 relative to the substrate 210 and is coupled to an electrode drive unit 523 to move the electrodes 520 over the surface of the conductive portion 211 in a manner generally similar to that described above with reference to FIG. 4.

In one aspect of the embodiment shown in FIG. 5, the apparatus 560 further includes an electrolyte vessel 530 having a supply conduit 537 with an aperture 538 positioned proximate to the electrodes 520. Accordingly, an electrolytic liquid 531 can be deposited locally in an interface region 539 between the electrodes 520 and the conductive portion 211, without necessarily covering the entire conductive portion 211. The electrolytic liquid 531 and the conductive material removed from the conductive portion 211 flow over the substrate 210 and collect in an electrolyte receptacle 532. The mixture of electrolytic liquid 531 and conductive material can flow to a reclaimer 533 that removes most of the conductive material from the electrolytic liquid 531. A filter 534 positioned downstream of the reclaimer 533 provides additional filtration of the electrolytic liquid 531, and a pump 535 returns the reconditioned electrolytic liquid 531 to the electrolyte vessel 530 via a return line 536.

In another aspect of an embodiment shown in FIG. 5, the apparatus 560 can include a sensor assembly 550 having a sensor 551 positioned proximate to the conductive portion 211, and a sensor control unit 552 coupled to the sensor 551 for processing signals generated by the sensor 551. The control unit 552 can also move the sensor 551 relative to the microelectronic substrate 210. In a further aspect of this embodiment, the sensor assembly 550 can be coupled via a feedback path 553 to the electrode drive unit 523 and/or the substrate drive unit 541. Accordingly, the sensor 551 can determine which areas of the conductive portion 211 require additional material removal and can move the electrodes 520 and/or the microelectronic substrate 210 relative to each other to position the electrodes 520 over those areas. Alternatively, (for example, when the removal process is highly repeatable), the electrodes 520 and/or the microelectronic substrate 210 can move relative to each other according to a pre-determined motion schedule.

Figure 6:
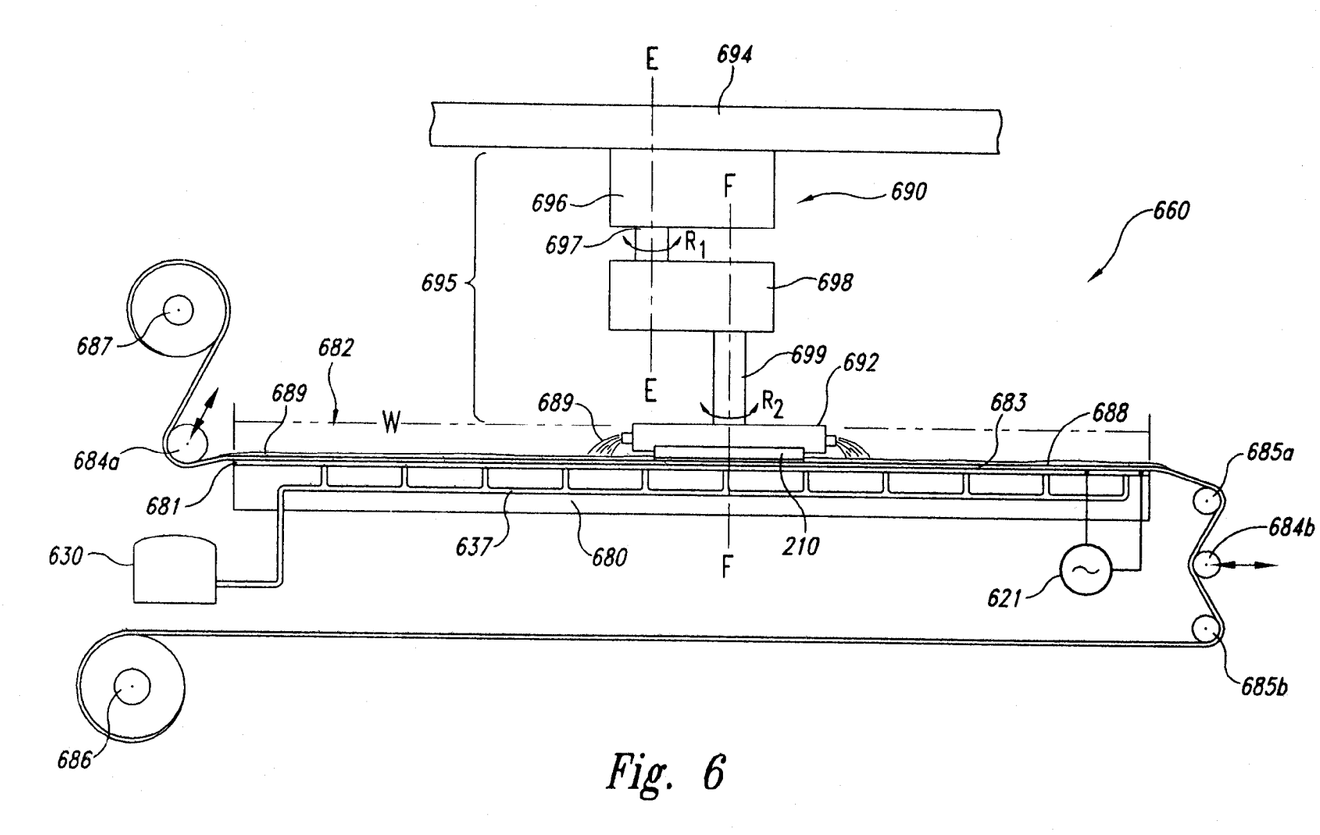
FIG. 6 is a partially schematic illustration of an apparatus for electrolytically, chemically-mechanically and/or electrochemically-mechanically removing conductive material from a microelectronic substrate in accordance with still another embodiment of the invention.

FIG. 6 schematically illustrates an apparatus 660 for electrolytically, chemically-mechanically and/or electrochemically-mechanically polishing the microelectronic substrate 210 in accordance with an embodiment of the invention. In one aspect of this embodiment, the apparatus 660 has a support table 680 with a top-panel 681 at a workstation where an operative portion "W" of a polishing pad 683 is positioned. The top-panel 681 is generally a rigid plate to provide a flat, solid surface to which a particular section of the polishing pad 683 may be secured during polishing.

The apparatus 660 can also have a plurality of rollers to guide, position and hold the polishing pad 683 over the top-panel 681. The rollers can include a supply roller 687, first and second idler rollers 684a and 684b, first and second guide rollers 685a and 685b, and a take-up roller 686. The supply roller 687 carries an unused or preoperative portion of the polishing pad 683, and the take-up roller 686 carries a used or postoperative portion of the polishing pad 683. Additionally, the first idler roller 684a and the first guide roller 685a can stretch the polishing pad 683 over the top-panel 681 to hold the polishing pad 683 stationary during operation. A motor (not shown) drives at least one of the supply roller 687 and the take-up roller 686 to sequentially advance the polishing pad 683 across the top-panel 681. Accordingly, clean preoperative sections of the polishing pad 683 may be quickly substituted for used sections to provide a consistent surface for polishing and/or cleaning the microelectronic substrate 210.

The apparatus 660 can also have a carrier assembly 690 that controls and protects the microelectronic substrate 210 during polishing. The carrier assembly 690 can include a substrate holder 692 to pick up, hold and release the microelectronic substrate 210 at appropriate stages of the polishing process. The carrier assembly 690 can also have a support gantry 694 carrying a drive assembly 695 that can translate along the gantry 694. The drive assembly 695 can have an actuator 696, a drive shaft 697 coupled to the actuator 696, and an arm 698 projecting from the drive shaft 697. The arm 698 carries the substrate holder 692 via a terminal shaft 699 such that the drive assembly 695 orbits the substrate holder 692 about an axis E-E (as indicated by arrow "$R_1$"). The terminal shaft 699 may also rotate the substrate holder 692 about its central axis F-F (as indicated by arrow "$R_2$").

The polishing pad 683 and a polishing liquid 689 define a polishing medium 682 that electrolytically, chemically-mechanically, and/or electro-chemically-mechanically removes material from the surface of the microelectronic substrate 210. In some embodiments, the polishing pad 683 may be a nonabrasive pad without abrasive particles, and the polishing liquid 689 can be a slurry with abrasive particles and chemicals to remove material from the microelectronic substrate 210. In other embodiments, the polishing pad 683 can be a fixed-abrasive polishing pad in which abrasive particles are fixedly bonded to a suspension medium. To polish the microelectronic substrate 210 with the apparatus 660, the carrier assembly 690 presses the microelectronic substrate 210 against a polishing surface 688 of the polishing pad 683 in the presence of the polishing liquid 689. The drive assembly 695 then orbits the substrate holder 692 about the axis E-E and optionally rotates the substrate holder 692 about the axis F-F to translate the substrate 210 across the polishing surface 688. As a result, the abrasive particles and/or the chemicals in the polishing medium 682 remove material from the surface of the microelectronic substrate 210 in a chemical and/or chemical-mechanical polishing process.

In a further aspect of this embodiment, the polishing liquid 689 can include an electrolyte for electrolytic processing or ECMP processing. In another embodiment, the apparatus 660 can include an electrolyte supply vessel 630 that delivers an electrolyte separately to the polishing surface 688 of the polishing pad 683 with a conduit 637, as described in greater detail below with reference to FIG. 7. In either embodiment, the apparatus 660 can further include a current supply 621 coupled to electrodes positioned proximate to the polishing pad 683. Accordingly, the apparatus 660 can electrolytically remove material from the microelectronic substrate 210.

Figure 7:
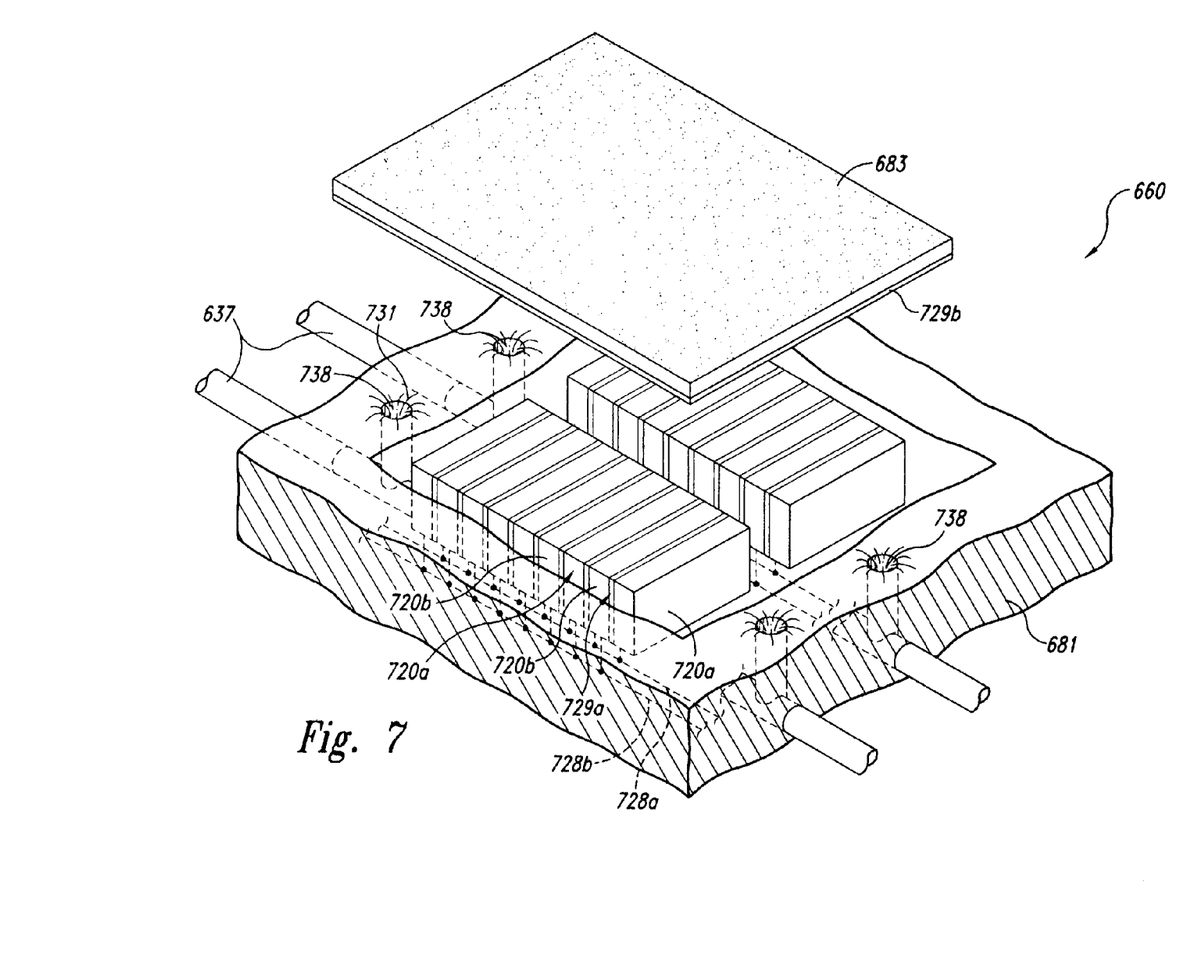
FIG. 7 is a partially schematic, isometric view of a portion of an embodiment of the apparatus shown in FIG. 6.

FIG. 7 is a partially exploded, partially schematic isometric view of a portion of the apparatus 660 described above with reference to FIG. 6. In one aspect of the embodiment shown in FIG. 6, the top-panel 681 houses a plurality of electrode pairs, each of which includes a first electrode 720a and a second electrode 720b. The first electrodes 720a are coupled to a first lead 728a and the second electrodes 720b are coupled to a second lead 728b. The first and second leads 728a and 728b are coupled to the current supply 621 (FIG. 6). In one aspect of this embodiment, the first electrodes 720a can be separated from the second electrodes 720b by an electrode dielectric layer 729a that includes Teflon™ or another suitable dielectric material. The electrode dielectric layer 729a can accordingly control the volume and dielectric constant of the region between the first and second electrodes 720a and 720b to control the electrical coupling between the electrodes.

The electrodes 720a and 720b can be electrically coupled to the microelectronic substrate 210 (FIG. 6) by the polishing pad 683. In one aspect of this embodiment, the polishing pad 683 is saturated with an electrolytic liquid 731 supplied by the supply conduits 637 through apertures 738 in the top-panel 681 just beneath the polishing pad 683. Accordingly, the electrodes 720a and 720b are selected to be compatible with the electrolytic liquid 731. In an another arrangement, the electrolytic liquid 731 can be supplied to the polishing pad 683 from above (for example, by disposing the electrolytic liquid 731 in the polishing liquid 689, rather than by directing the electrolytic liquid upwardly through the polishing pad 683). Accordingly, the apparatus 660 can include a pad dielectric layer 729b positioned between the polishing pad 683 and the electrodes 720a and 720b. When the pad dielectric layer 729b is in place, the electrodes 720a and 720b can be isolated from physical contact with the electrolytic liquid 731 and can accordingly be selected from materials that are not necessarily compatible with the electrolytic liquid 731.

Figure 8:
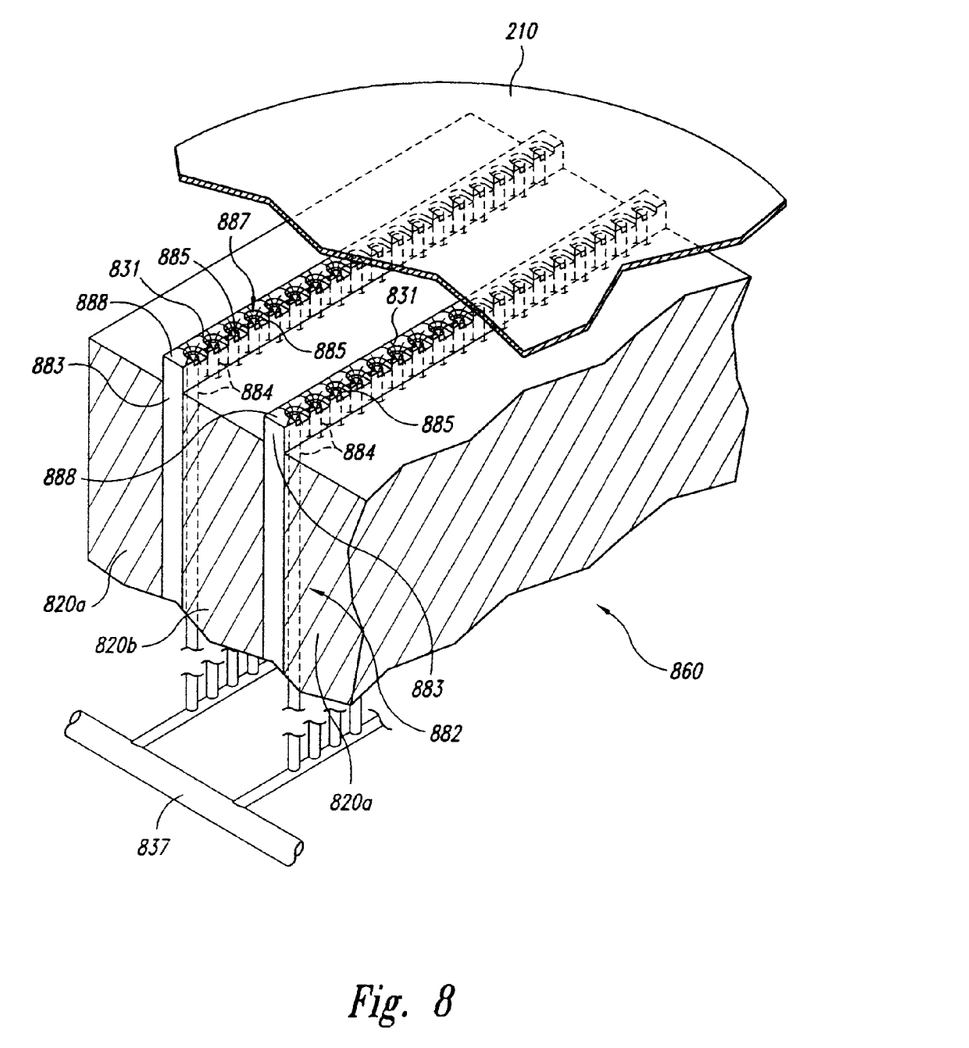
FIG. 8 is a partially schematic, isometric illustration of a portion of an apparatus for removing conductive material from a microelectronic substrate in accordance with yet another embodiment of the invention.

FIG. 8 is an isometric view of a portion of an apparatus 860 having electrodes 820 (shown as a first electrode 820a and a second electrode 820b), and a polishing medium 882 arranged in accordance with another embodiment of the invention. In one aspect of this embodiment, the polishing medium 882 includes polishing pad portions 883 that project beyond the electrodes 820a and 820b. Each polishing pad portion 883 can include a polishing surface 888 and a plurality of flow passages 884 coupled to a fluid source (not shown in FIG. 8) with a conduit 837. Each flow passage 884 can have an aperture 885 proximate to the polishing surface 888 to provide an electrolytic liquid 831 proximate to an interface between the microelectronic substrate 210 and the polishing surface 888. In one aspect of this embodiment, the pad portions 883 can include recesses 887 surrounding each aperture 885. Accordingly, the electrolytic liquid 831 can proceed outwardly from the flow passages 884 while the microelectronic substrate 210 is positioned directly overhead and remains spaced apart from the electrodes 820. In other embodiments, the polishing pad portions 883 can be applied to other electrodes, such as those described above with reference to FIGS. 4 and 5 to provide for mechanical as well as electromechanical material removed.

Figure 9:
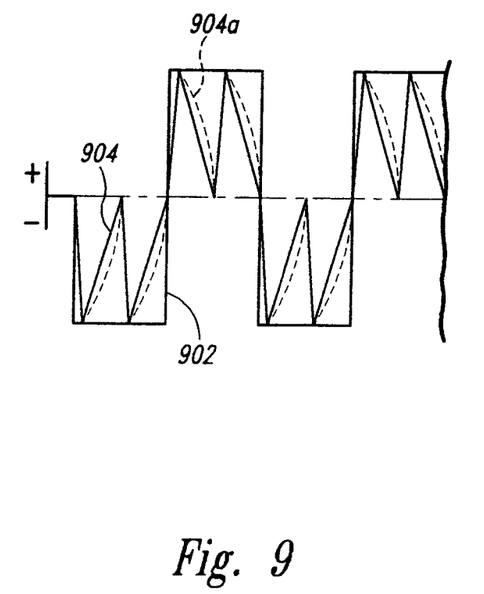
FIG. 9 is a schematic illustration of a waveform for electrolytically processing a microelectronic substrate in accordance with still another embodiment of the invention.

The foregoing apparatuses described above with reference to FIGS. 4-8 can be used to electrolytically, chemically-mechanically and/or electrochemically-mechanically process the microelectronic substrate 210. When the apparatuses are used to electrolytically or electrochemically-mechanically process the microelectronic substrate 210, they can provide a varying electrical current that passes from the electrodes, through the conductive material of the microelectronic substrate 210 via the electrolytic liquid. For example, as shown in FIG. 9, the apparatus can generate a high-frequency wave 904 and can superimpose a low-frequency wave 902 on the high-frequency wave 904. In one aspect of this embodiment, the high-frequency wave 904 can include a series of positive or negative voltage spikes contained within a square wave envelope defined by the low-frequency wave 902. Each spike of the high-frequency wave 904 can have a relatively steep rise-time slope to transfer charge through the dielectric material to the electrolytic liquid, and a more gradual fall-time slope. The fall-time slope can define a straight line, as indicated by high-frequency wave 904, or a curved line, as indicated by high-frequency wave 904a. In other embodiments, the high-frequency wave 904 and the low-frequency wave 902 can have other shapes depending, for example, on the particular characteristics of the dielectric material and the electrolytic liquid, the characteristics of the microelectronic substrate 210, and/or the target rate at which conductive material is to be removed from the microelectronic substrate 210.

The methods described above with reference to FIGS. 2A-3 may be performed with the apparatuses described above with reference to FIGS. 4-9 in a variety of manners in accordance with several embodiments of the invention. For example, in one embodiment, a single apparatus can be used to electrolytically remove first the second conductive material 209 and then the first and second conductive materials 218, 209 simultaneously. Alternatively, one apparatus can initially remove the second material 209 (e.g., via CMP) and the same or another apparatus can subsequently remove both the first and second conductive materials 218, 209. In either embodiment, both the first an second conductive materials 218, 209 can be removed simultaneously when they are exposed. In one aspect of both embodiments, the downforce applied to the microelectronic substrate 210 can be reduced or eliminated during electrolytic processing. In another aspect of these embodiments, a selected downforce can be applied to the microelectronic substrate 210 during electrolytic processing to supplement the electrolytic removal process with a mechanical removal process. The electrolytic removal process can also be supplemented with a chemical removal process in addition to or in lieu of the mechanical removal process.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

I claim:

1. A method for processing a microelectronic substrate, the method comprising:
   selecting a pH based at least partially on an absolute value of a difference between a first open circuit potential of a second conductive material at the pH and a second open circuit potential of a second conductive material at the pH, wherein the second conductive material is different than the first conductive material;
   contacting a surface of a microelectronic substrate with an electrolytic liquid having the selected pH, wherein the microelectronic substrate includes the first and second conductive materials; and
   simultaneously removing at least portions of the first and second conductive materials from the microelectronic substrate while passing electrical current through the electrolytic liquid and the first and second conductive materials and while the electrolytic liquid is in contact with the microelectronic substrate.

2. The method of claim 1 wherein:
   the first conductive material includes tungsten; and
   the second conductive material includes copper.

3. The method of claim 1 wherein passing the electrical current includes passing the electrical current:
   from a first electrode spaced apart from the microelectronic substrate, through the electrolytic liquid to the microelectronic substrate; and
   from the microelectronic substrate, through the electrolytic liquid to a second electrode spaced apart from the first electrode and spaced apart from the microelectronic substrate.

4. The method of claim 1 wherein passing the electrical current includes passing the electrical current:
   from a first electrode spaced apart from the microelectronic substrate, through the electrolytic liquid to the microelectronic substrate; and
   from the microelectronic substrate to a second electrode spaced apart from the first electrode and in contact with the microelectronic substrate.

5. The method of claim 1 wherein the first and second conductive materials are adjacent to one another within the microelectronic substrate.

6. The method of claim 1 wherein:
   the first conductive material of the microelectronic substrate is a barrier layer material; and
   the second conductive material of the microelectronic substrate is a blanket fill material.

7. The method of claim 1 wherein simultaneously removing at least portions of the first and second conductive materials from the microelectronic substrate includes simultaneously removing at least portions of the first and second conductive materials from the microelectronic substrate while increasing a resistance of the electrolytic liquid.

8. The method of claim 1 wherein passing the electrical current through the electrolytic liquid and the first and second conductive materials includes passing a varying electrical signal through the electrolytic liquid and the first and second conductive materials.

9. A method for processing a microelectronic substrate, the method comprising:
   providing a microelectronic substrate including a first conductive material and a second conductive material different than the first conductive material;
   disposing on the microelectronic substrate an electrolytic liquid having a pH selected at least partially based on an absolute value of a difference between a first open circuit potential of the first conductive material at the pH and a second open circuit potential of the second conductive material at the pH; and
   simultaneously removing at least portions of the first and second conductive materials from the microelectronic substrate while passing electrical current through the electrolytic liquid and the first and second conductive materials and while the electrolytic liquid is in contact with the microelectronic substrate.

10. The method of claim 9 wherein:
    the first conductive material includes tungsten; and
    the second conductive material includes copper.

11. The method of claim 10 wherein the pH is within a range from 2 to 5.

12. The method of claim 9 wherein:
    the first conductive material of the microelectronic substrate is a barrier layer materials; and
    the second conductive material of the microelectronic substrate is a blanket fill material.

13. The method of claim 9 wherein simultaneously removing at least portions of the first and second conductive materials from the microelectronic substrate includes simultaneously removing at least portions of the first and second conductive materials from the microelectronic substrate while contacting the microelectronic substrate with a polishing pad and moving at least one of the polishing pad and the microelectronic substrate relative to the other.

14. The method of claim 1 wherein simultaneously removing at least portions of the first and second conductive materials from the microelectronic substrate includes simultaneously removing at least portions of the first and second conductive materials from the microelectronic substrate while contacting the microelectronic substrate with a polishing pad and moving at least one of the polishing pad and the microelectronic substrate relative to the other.

15. The method of claim 2 wherein selecting the pH includes selecting the pH such that the absolute value of the difference between the first and second open circuit potentials at the pH is not more than 0.25 volts.

16. The method of claim 2 wherein selecting the pH includes selecting the pH such that the absolute value of the difference between the first and second open circuit potentials at the pH is not more than 0.15 volts.

17. The method of claim 9 wherein simultaneously removing at least portions of the first and second conductive materials from the microelectronic substrate includes simultaneously removing at least portions of the first and second conductive materials from the microelectronic substrate while increasing a resistance of the electrolytic liquid.

18. The method of claim 9 wherein the first and second conductive materials are adjacent to one another within the microelectronic substrate.

19. The method of claim 11 wherein the pH is selected at least partially based on the absolute value of the difference between the first and second open circuit potentials at the pH being not more than 0.25 volts.

20. The method of claim 11 wherein the pH is selected at least partially based on the absolute value of the difference between the first and second open circuit potentials at the pH being not more than 0.15 volts.

* * * * *

UNITED STATES PATENT AND TRADEMARK OFFICE
CERTIFICATE OF CORRECTION

| | |
|---|---|
| PATENT NO. | : 9,214,359 B2 |
| APPLICATION NO. | : 14/281606 |
| DATED | : December 15, 2015 |
| INVENTOR(S) | : Chopra |

Page 1 of 1

It is certified that error appears in the above-identified patent and that said Letters Patent is hereby corrected as shown below:

In the claims

Claim 1, lines 4-5, delete "a first open circuit potential of a second conductive material"
insert --a first open circuit potential of a first conductive material--.

Signed and Sealed this
Fifteenth Day of March, 2016

Michelle K. Lee
*Director of the United States Patent and Trademark Office*